United States Patent
Park

(10) Patent No.: US 7,199,012 B2
(45) Date of Patent: Apr. 3, 2007

(54) METHOD OF FORMING A TRENCH IN A SEMICONDUCTOR DEVICE

(75) Inventor: Geon-Ook Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 135 days.

(21) Appl. No.: 10/748,652

(22) Filed: Dec. 30, 2003

(65) Prior Publication Data

US 2004/0157404 A1    Aug. 12, 2004

(30) Foreign Application Priority Data

Jan. 9, 2003    (KR) .................. 10-2003-0001410

(51) Int. Cl.
*H01L 21/336*    (2006.01)
(52) U.S. Cl. ................. 438/270; 438/700; 257/E21.24; 257/E21.25
(58) Field of Classification Search ............... 438/424, 438/426, 427, 270, 700; 257/E21.25, E21.24
See application file for complete search history.

(56) References Cited

U.S. PATENT DOCUMENTS

| | | | |
|---|---|---|---|
| 4,693,781 A | | 9/1987 | Leung et al. |
| 5,915,195 A | | 6/1999 | Fulford, Jr. et al. |
| 5,933,748 A | * | 8/1999 | Chou et al. ............ 438/431 |
| 6,004,864 A | | 12/1999 | Huang et al. |
| 6,008,526 A | * | 12/1999 | Kim ...................... 257/647 |
| 6,184,108 B1 | * | 2/2001 | Omid-Zohoor et al. ..... 438/431 |
| 2003/0170964 A1 | * | 9/2003 | Kao et al. ............... 438/433 |

FOREIGN PATENT DOCUMENTS

KR    1998-026303    7/1998

OTHER PUBLICATIONS

Stanley Wolf and Richard Tauber, Silicon Processing for the VLSI Era, 2000, Lattice Press, vol. 1, p. 675.*

* cited by examiner

*Primary Examiner*—Michelle Estrada
*Assistant Examiner*—Nicholas J. Tobergte
(74) *Attorney, Agent, or Firm*—Andrew D. Fortney

(57) ABSTRACT

A method for forming a trench in a semiconductor device is disclosed. An example method forms a pad oxide film and a silicon nitride film on a semiconductor substrate, selectively etches the silicon nitride film and the pad oxide film on a region to be formed with a trench, and implants oxygen ions into the semiconductor substrate in the region to be formed with the trench. The example method also forms an oxide in the semiconductor substrate by reacting the oxygen ions with the semiconductor substrate through a thermal diffusion of the oxygen ions, forms the trench by etching the semiconductor substrate and the oxide on the region to be formed with the trench using the silicon nitride film as a mask, forms a liner oxide film on an inner wall of the trench using a thermal diffusion process, and forms an insulation film on the liner oxide film such that the trench is filled.

4 Claims, 3 Drawing Sheets

METHOD OF FORMING A TRENCH IN A SEMICONDUCTOR DEVICE

FIELD OF THE DISCLOSURE

The present disclosure relates generally to semiconductor devices and, more particularly, to a method for filling a trench formed as a field area to isolate one active area from another with an insulation material without any voids.

BACKGROUND

Shallow trench isolation (STI) structures have been widely used as isolation structures within semiconductor devices. These STI structures are advantageous to miniaturization of semiconductor devices because a size of field area is limited to a desired size of trench by forming a trench in a semiconductor substrate and filling the trench with insulation material. Conventional techniques for these STI structures are disclosed in U.S. Pat. Nos. 6,004,864, 5,915,195, and 4,693,781. A conventional method for fabricating an STI structure is described below.

FIGS. 1a to 1d are sectional views showing a conventional STI fabrication method. First, as shown in FIG. 1a, a pad oxide film 2 is deposited at a thickness of about 200 Å on an entire surface of a silicon substrate 1, a silicon nitride film 3 is deposited at a thickness of about 2,000 Å on the pad oxide film 2, a photosensitive film is applied and exposed on the silicon nitride film 3, and then a pattern of photosensitive film 4 is formed by removing only the photosensitive film on a region to be formed with a trench. Next, as shown in FIG. 1b, a trench 100 is formed in the silicon substrate 1 by dry etching the silicon nitride film 3 exposed, the pad oxide film 2 and the silicon substrate 1 up to a predetermined depth using the pattern of photosensitive film 4 as a mask, the pattern of photosensitive film 4 is removed, and then a cleaning process is performed. By the way, an edge at which a side and a bottom of the formed trench 100 intersect forms a right angle. It is very difficult to decrease this angle so that the edge is gently slanted. Next, as shown in FIG. 1c, a liner oxide film 5 is formed at an inner wall of the trench 100 using a thermal diffusion process. At this time, the liner oxide film 5 is formed at about 60% of its total thickness inside the silicon substrate 1 and at about 40% of the total thickness outside the silicon substrate 1 by a typical thermal diffusion process, centering at a surface (shown as a dotted line in FIG. 1c) of the silicon substrate 1 of the trench. During the thermal diffusion process for the formation of the liner oxide film 5, as an angle of an edge at which a side and a bottom of the trench 100 intersect becomes smaller, oxygen molecules have more difficulty penetrating into the silicon substrate. A nearly vertical edge provides a condition under which oxygen molecules cannot easily penetrate into the silicon substrate. Therefore, a lower surface of the liner oxide film 5 located inside the silicon substrate 1 has a smooth curve at the edge of the trench, while an upper surface of the liner oxide film 5 located outside the silicon substrate 1 keeps a nearly vertical edge angle formed before the thermal diffusion process.

Next, as shown in FIG. 1d, a field oxide 6 is thickly deposited on an entire surface of the silicon nitride film 3 including the liner oxide film 5 such that the trench 100 is sufficiently filled. Since the field oxide 6 is deposited with a surface state as shown as a dotted line in FIG. 1d, a void 200 is generated without complete filling of the trench when the field oxide 6 is formed on the top surface of the liner oxide film 5 having the nearly vertical edge angle. If this void 200 is excessive, it is exposed when a chemical and mechanical polishing for planarization of the filed oxide 6 is performed later, which results in increased difficulty of the planarization.

In addition, in a state where the void is exposed after the planarization, when a polysilicon to be deposited for formation of an electrode in a subsequent process enters the void, a leakage current that causes an erroneous operation of a device is produced, and a circuit-short between adjacent devices breaks out, giving a fatal adverse effect on the devices. The above problems become more severe as the width of the trench becomes narrower.

DETAILED DESCRIPTION

As described in greater detail below, an example method forms a field oxide such that a trench is completely filled without any void. More specifically, an example formation method of a trench in a semiconductor device forms a silicon oxide by implanting oxygen ions into a silicon substrate and thermally diffusing them. The example method then forms a trench by etching the silicon substrate and the silicon oxide such that an edge at which a side and a bottom of the trench intersect has a smooth curve so that the trench is completely filled with a field oxide without any void.

One example method for forming a trench in a semiconductor device forms a pad oxide film and a silicon nitride film on a semiconductor substrate, selectively etches the silicon nitride film and the pad oxide film on a region to be formed with a trench, implants oxygen ions into the semiconductor substrate in the region to be formed with the trench and forms an oxide in the semiconductor substrate by reacting the oxygen ions with the semiconductor substrate through a thermal diffusion of the oxygen ions. In addition, the example method forms the trench by etching the semiconductor substrate and the oxide on the region to be formed with the trench using the silicon nitride film as a mask, forms a liner oxide film on an inner wall of the trench using a thermal diffusion process, and forms an insulation film on the liner oxide film such that the trench is filled.

Preferably, when the oxygen ions are implanted, a second photosensitive film pattern having an opening portion of a width narrower than that of an opening portion of a first photosensitive film pattern is formed on the silicon nitride film and the exposed semiconductor substrate, the opening portion of the second photosensitive film pattern having the center axis as the opening portion of the first photosensitive film pattern, the oxygen ions are implanted using the second photosensitive film pattern as a mask, and the oxygen ions are implanted into the semiconductor substrate at a desired depth of the trench. Also, preferably, the oxygen ions are thermally diffused in a nitrogen atmosphere.

Figure 1A:
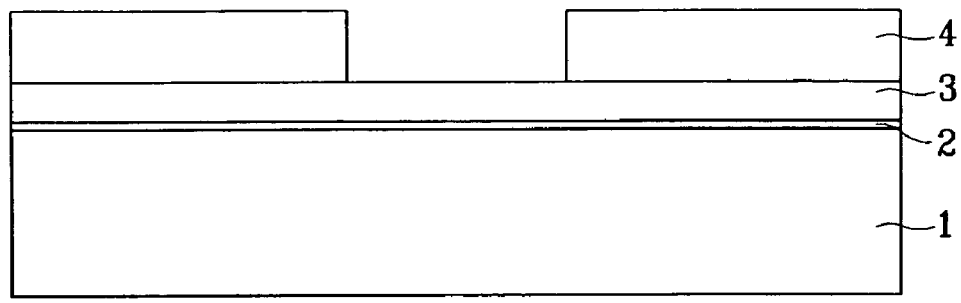
FIGS. 1a to 1d are sectional views showing a conventional method for forming a trench in a conventional semiconductor device.
Figure 1B:
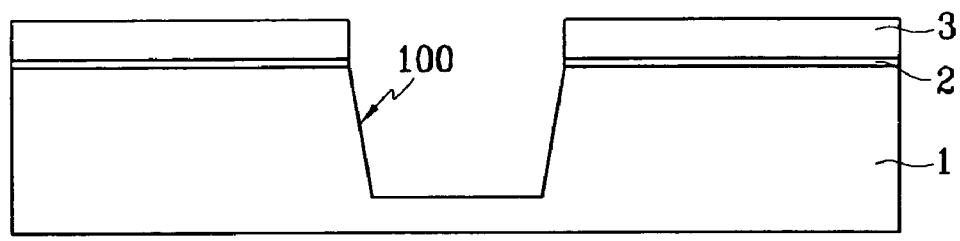
Figure 1C:
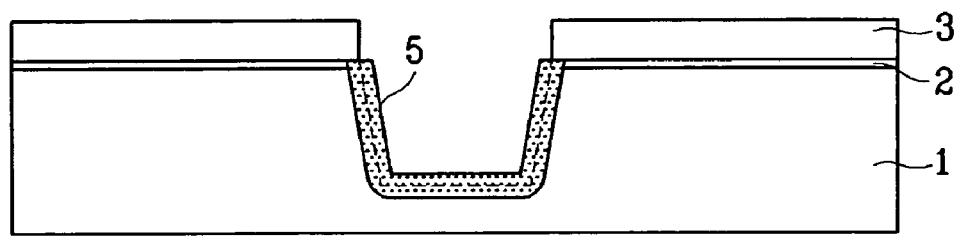
Figure 1D:
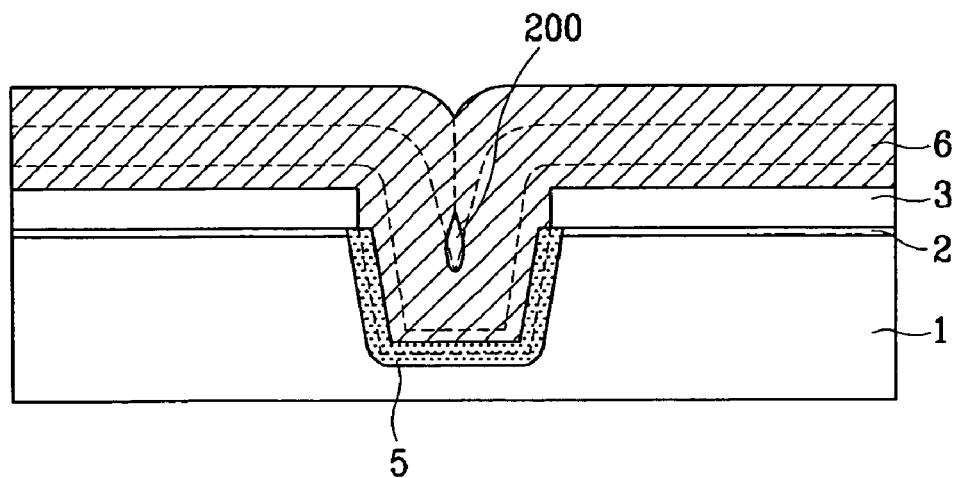
Figure 2A:
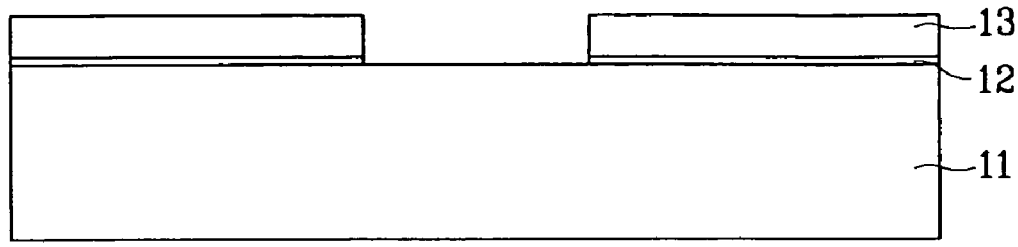
FIGS. 2a to 2f are sectional views showing an example method for forming a trench in an example semiconductor device.

FIGS. 2a to 2f are sectional views showing an example method for forming a trench in a semiconductor device. First, as shown in FIG. 2a, a pad oxide film 12 is thinly deposited on a semiconductor substrate 11, a silicon nitride film 13 is deposited on the pad oxide film 12, and then a trench pattern is formed by selectively etching the silicon nitride film 13 and the pad oxide film 12 on a region to be formed with a trench.

At this time, the pad oxide film 12 is optionally deposited to suppress a stress of the silicon nitride film 13 to be transferred to the semiconductor substrate 11, and is preferably deposited at a thickness of about 100–300 Å (e.g., 200 Å). Because the silicon nitride film 13 is made of material having a high selectivity over the pad oxide film, it functions as a termination layer in a subsequent chemical and mechanical polishing process for the field oxide, and is preferably deposited at a thickness of about 1,000–3,000 Å (e.g., 2,000 Å).

When the trench pattern is formed, a first photosensitive film pattern (not shown) is formed by applying and exposing a photosensitive film on the silicon nitride film 13 to remove only the photosensitive film on the region to be formed with the trench, and then the silicon nitride film 13 and the pad oxide film 12 exposed are etched using the first photosensitive film pattern as a mask.

Figure 2B:
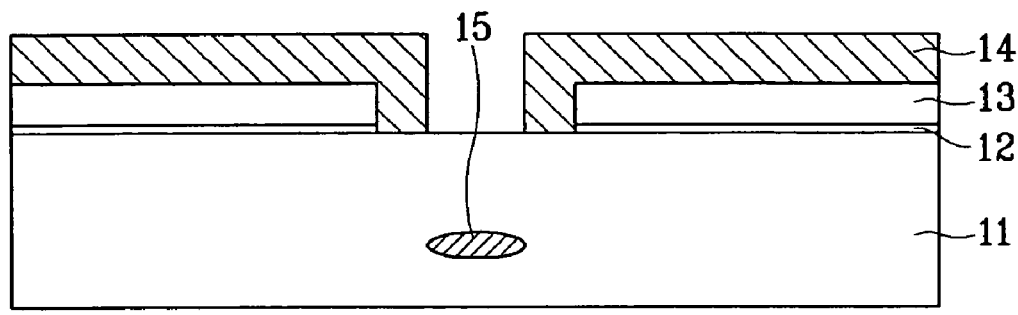

Next, as shown in FIG. 2b, a second photosensitive film pattern 14 having an opening portion of a width narrower than that of an opening portion of the trench pattern is formed by applying, exposing and developing a photosensitive film on the silicon nitride film 13 and the exposed semiconductor substrate 11.

At this time, the opening portion of the second photosensitive film pattern 14 has the same center axis as the opening portion of the trench pattern formed earlier, and the width of the opening portion of the second photosensitive film pattern 14 is set in proportion to a degree of thermal diffusion of oxygen ions. Subsequently, an implantation region 15 is formed by implanting the oxygen ions into the semiconductor substrate 11 using the second photosensitive film pattern 14 as a mask. At this time, a depth from a surface of the semiconductor substrate 11 at which the implantation region 15 is located is a depth of the bottom of the trench to be formed later.

Figure 2C:
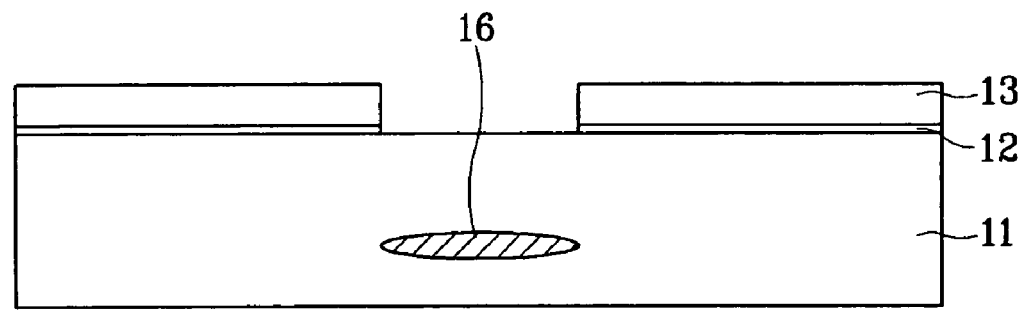

Next, after the second photosensitive pattern 14 is removed and a cleaning process is performed, a silicon oxide 16 is formed by thermally diffusing the oxygen ions implanted into the implantation region 15 to the silicon substrate 11 through a thermal diffusion process in a nitrogen atmosphere and reacting the oxygen ions with silicon particles in the silicon substrate 11, as shown in FIG. 2c. At this time, the thermal diffusion process is performed in the nitrogen atmosphere to prevent the surface of the silicon substrate 11 from reacting with the oxygen ions during the thermal diffusion process.

Figure 2D:
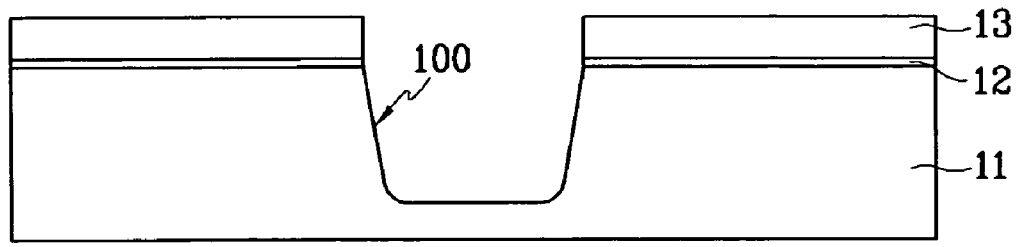

Next, as shown in FIG. 2d, a trench 100 is formed by etching the exposed silicon substrate 11 and the silicon oxide 16 exposed during the etching of the silicon substrate 11, using the silicon nitride film 13 as a mask. At this time, the silicon substrate 11 in a side and edge of the trench is etched while the bottom of the trench is formed by etching the silicon oxide 16 having an etching rate different from that of the silicon substrate 11. As a result, due to the bottom of the trench, the edge at which the side and bottom of the trench intersect has a curved surface.

Figure 2E:
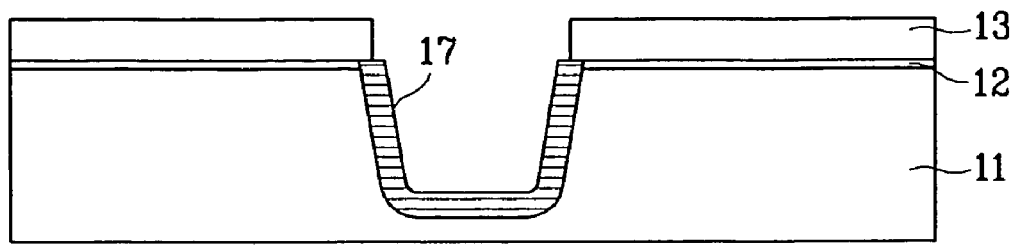

Next, as shown in FIG. 2e, a liner oxide film 17 is formed at an inner wall of the trench 100 by using a thermal diffusion process. At this time, the liner oxide film 17 is formed at about 60% of its total thickness inside the semiconductor substrate 11 and at about 40% of the total thickness outside the silicon substrate 11 using a typical thermal diffusion process, centering at a surface of the semiconductor substrate 11 of the trench.

Figure 2F:
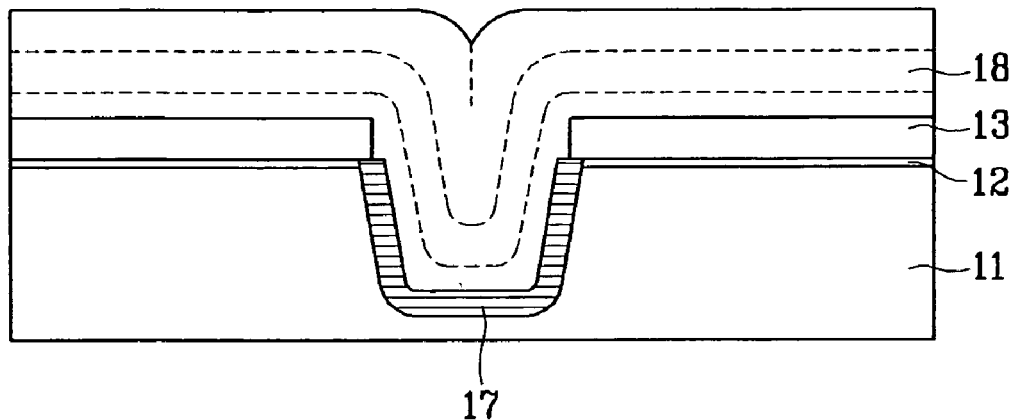

In addition, because the liner oxide film 17 is formed just as a surface shape of the trench shown in FIG. 2d, a top surface of the liner oxide film 17 has a smooth curve at the edge at which the side and bottom of the trench intersect. Next, as shown in FIG. 2f, a field oxide 18 is thickly formed on the entire top surface of the silicon nitride film 13 including the liner oxide film 17 such that the trench 100 is sufficiently filled. Because the field oxide 18 is deposited to have a surface state as shown by a dotted line in FIG. 2f and is deposited on a top surface of the liner oxide film 17 whose edge has a smooth curve, the trench can be completely filled with any void.

Finally, the trench isolation process is completed by chemically and mechanically polishing and planarizing the field oxide 18 until the silicon nitride film 13 is exposed.

As described above, in the example method of forming a trench in a semiconductor device, because a silicon oxide is formed by implanting oxygen ions into a silicon substrate and thermally diffusing them and then a trench is formed by etching the silicon substrate and the silicon oxide, an edge at which a side and a bottom of the trench intersect has a smooth curve such that the trench is completely filled with a field oxide without any void. Accordingly, the deterioration of the reliability of device due to a leakage current or circuit short by voids can be prevented and the device yield can be improved.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method for forming a trench in a semiconductor device comprising:
   forming a pad oxide film and a silicon nitride film on a silicon wafer;
   forming a first photosensitive film pattern on the region to be formed with the trench by applying, exposing, and developing a photosensitive film on the silicon nitride film;
   selectively etching the silicon nitride film and the pad oxide film on a region to be formed with a trench using the first photosensitive film pattern as a mask;
   forming a second photosensitive film pattern having an opening portion of a width narrower than that of an opening portion of the first photosensitive film pattern on the silicon nitride film and the exposed silicon wafer, the opening portion of the second photosensitive film pattern having a center axis as the opening portion of the first photosensitive film pattern;
   implanting oxygen ions into the silicon wafer in the region to be formed with the trench at a desired depth of the trench using the second photosensitive film pattern as a mask;
   forming an oxide in the silicon wafer by reacting the oxygen ions with the silicon wafer through a thermal diffusion of the oxygen ions;
   forming the trench by etching the silicon wafer and the oxide on the region to be formed with the trench using the silicon nitride film as a mask;
   forming a liner oxide film on an inner wall of the trench using a thermal diffusion process; and
   forming an insulation film on the liner oxide film such that the trench is filled, wherein an edge at which a side end a bottom of the trench intersect has a curved surface.

2. The method of claim 1, wherein, during thermal diffusion of the oxygen ions the oxygen ions are thermally diffused in a nitrogen atmosphere.

3. A method for forming a trench in a semiconductor device comprising:
   forming a pad oxide film and a silicon nitride film on a silicon wafer;

forming a first a photosensitive film pattern on the region to be formed with the trench by applying, exposing, and developing a photosensitive film on the silicon nitride film;

selectively etching the silicon nitride film and the pad oxide film on a region to be formed with a trench using the first photosensitive film pattern as a mask;

forming a second photosensitive film pattern having an opening portion of a width narrower than that of an opening portion of the first photosensitive film pattern on the silicon nitride film and the exposed silicon wafer, the opening portion of the second photosensitive film pattern having a center axis as the opening portion of the first photosensitive film pattern;

implanting oxygen ions into the silicon wafer in the region to be formed with the trench at a desired depth of the trench using, the second photosensitive film pattern as a mask;

forming an oxide in the silicon wafer by reacting the oxygen ions with the silicon wafer through a thermal diffusion of the oxygen ions;

forming the trench by etching the silicon wafer and the oxide on the region to be formed with the trench using the silicon nitride film as a mask;

forming a liner oxide film on an inner wail of the trench using a thermal diffusion process; and forming an insulation film on the liner oxide film such that the trench is filled, wherein an oxide film is formed on an entire top surface including the silicon nitride film and the trench such that the trench is filled, and then the oxide film is chemically and mechanically polished until the silicon nitride film is exposed.

wherein an edge at which a side and a bottom of the trench intersect has a curved surface.

4. The method of claim 1, wherein said step of forming the trench comprises etching the silicon wafer and the oxide on the region to be formed with the trench at different rates.

* * * * *